United States Patent [19]

Rempt

[11] Patent Number: 5,132,620
[45] Date of Patent: Jul. 21, 1992

[54] SURFACE/SUBSURFACE CORROSION DETECTOR WITH OPTICAL PATHS ALTERABLE BY MAGNETICALLY SENSITIVE TRANSDUCERS

[75] Inventor: Raymond D. Rempt, Woodinville, Wash.

[73] Assignee: The Boeing Company, Seattle, Wash.

[21] Appl. No.: 525,842

[22] Filed: May 21, 1990

[51] Int. Cl.⁵ .............. G01R 33/032; G01R 19/15; G01N 27/72; G01N 27/26
[52] U.S. Cl. .................................. 324/244.1; 324/71.2
[58] Field of Search ............. 324/244.1, 67, 71.2, 324/529; 350/375–378

[56] References Cited

U.S. PATENT DOCUMENTS

| | | | |
|---|---|---|---|
| 2,501,598 | 3/1950 | Eltenton et al. | 324/67 |
| 3,745,452 | 7/1973 | Osburn et al. | 324/254 X |
| 4,371,838 | 2/1983 | Griscom | 324/244.1 |
| 4,376,248 | 3/1983 | Giallorenzi et al. | 324/96 X |
| 4,378,497 | 3/1983 | Giallorenzi | 250/227 |
| 4,433,291 | 2/1984 | Yariv et al. | 324/244.1 |
| 4,523,147 | 6/1985 | D'Angelo et al. | 324/248 |
| 4,587,487 | 5/1986 | Zanzucchi | 324/244.1 |
| 4,591,786 | 5/1986 | Koo et al. | 324/244.1 |
| 4,591,787 | 5/1986 | Hoenig | 324/248 |
| 4,600,885 | 7/1986 | Koo et al. | 324/244.1 |
| 4,603,296 | 7/1986 | Koo et al. | 324/244.1 |
| 4,609,871 | 9/1986 | Bobb | 324/244.1 |
| 4,613,816 | 9/1986 | Zeamer | 324/248 |
| 4,622,460 | 11/1986 | Failes et al. | 250/227 |
| 4,634,977 | 1/1987 | Lenz et al. | 324/244.1 |
| 4,644,273 | 2/1987 | Bobb | 324/244.1 |
| 4,650,281 | 3/1987 | Jaeger et al. | 350/96.33 |
| 4,656,421 | 4/1987 | Ellis et al. | 324 |
| 4,665,363 | 5/1987 | Extance et al. | 324/244.1 |
| 4,675,522 | 6/1987 | Arunkumar | 250/227 |
| 4,687,993 | 8/1987 | Mermelstein | 324/244 |
| 4,697,146 | 9/1987 | Extance et al. | 324/244.1 |
| 4,700,135 | 10/1987 | Hoenig | 324/248 |
| 4,712,065 | 12/1987 | Pitt et al. | 324/244.1 |
| 4,742,300 | 5/1988 | Lenz et al. | 324/244.1 |
| 4,814,706 | 3/1989 | Rempt | 324/244.1 |
| 4,904,940 | 2/1990 | Rempt | 324/244.1 |

OTHER PUBLICATIONS

J. G. Bellingham and M. L. A. MacVicar in "Squid Technology Applied to the Study of Electrochemical Corrosion", (IEEE Transactions on Magnetics, vol. MAG-23, No. 2, Mar. 1987).

Primary Examiner—Gerard R. Strecker
Attorney, Agent, or Firm—Foley & Lardner

[57] ABSTRACT

A fiber optic magnetic field gradiometer uses the first derivative of a magnetic field associated with a corrosion process to determine the location on the surface of a metal of the corrosion at its onset or very early stages, whereas eddy current type detectors detect the corrosion only after a significant amount of the metal has already been removed. Two adjacent flat magnetic transducers made of magneto-strictive glass, onto which are secured two optical fibers, are immersed in an applied magnetic field to null out material differences in the earth's magnetic field. The optical fibers are secured to a surface of each transducer to provide a relatively flat sandwiched pair of transducers. The flat magnetic transducers are sandwiched together and scanned over the metal surface. A magnetic field associated with the corrosion process in the direction of the axis of the flat magnetic transducers causes an optical path length change in the fibers. The overall path length's change is proportional to the first derivative of the magnetic field.

42 Claims, 5 Drawing Sheets

X AXIS IS SENSITIVE AXIS (SA)

SURFACE/SUBSURFACE CORROSION DETECTOR WITH OPTICAL PATHS ALTERABLE BY MAGNETICALLY SENSITIVE TRANSDUCERS

BACKGROUND OF THE INVENTION

This invention relates generally to surface and subsurface corrosion detectors and in particular to a fiber optic magnetic field gradiometer for detecting magnetic gradients generated by electrochemical corrosion reactions.

The flow of metal ions between two metal surfaces occurs during the corrosion process. Since magnetic fields are associated with current flow, a corrosion process has an associated magnetic field. Therefore, corrosion can be located and identified by detecting these magnetic fields.

A variety of techniques have been developed for studying electrochemical corrosion, including actually weighing the material lost from a sample, monitoring the voltage which develops between two corroding electrodes, or even determining the equivalent circuit of a multielectrode cell by measuring its frequency response. However, the above-mentioned techniques are necessarily invasive and/or destructive. It is of interest to detect corrosion currents in a non-invasive non-destructive manner.

Magnetic fields associated with corrosion have been detected and reported by J. G. Bellingham and M. L. A. MacVicar in "SQUID Technology Applied to the Study of Electrochemical Corrosion," (IEEE Transactions on Magnetics, Vol. MAG-23, No. 2, March 1987). There a SQUID gradiometer was used to detect the magnetic fields associated with electrochemical reactions or corrosion. Since a SQUID device must be immersed in liquid helium, its associated dewars and insulation restrict the sensor to be at least 2 centimeters away from the surface. In addition, such bulky dewars make it impractical to actually scan a SQUID sensor over a surface.

Accordingly, it is an object of the present invention to provide a method and apparatus capable of scanning and detecting corrosion at the surface or subsurface of a metal. It is a further object of the invention to provide an apparatus that is small and lightweight. Other objects and advantages of the invention will be more apparent hereinafter in reference to the detailed description of the preferred embodiments and the drawings.

SUMMARY OF THE INVENTION

Two flat magnetic transducers are each wrapped with a single mode optical fiber and sandwiched on top of each other. The fibers are so attached to the transducers that good coupling results when the transducers are subjected to a magnetic field of magnitude which is desired to be detected. The transducers along with their respective fibers are immersed in an applied magnetic field to balance out material differences and the earth's magnetic field, and to establish an appropriate bias field level. Light from a laser is then launched into the two single mode optical fibers and recoupled after passing through the fibers. A magnetic field along the sensitive axis, of the transducer causes magneto-strictive glass in the transducer to expand or contract, thereby changing the optical path length. The output of the coupler is then used to determine the overall path length change which is proportional to the first derivative of the magnetic field.

DETAILED DESCRIPTION OF THE PREFERRED EMBODIMENTS

Figure 1:
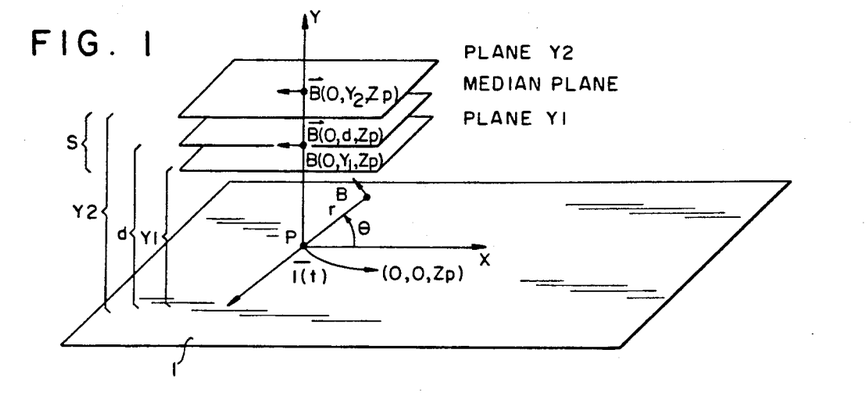
FIG. 1 represents the relationship between a line current in the Z direction confined to the X-Z plane and its associated magnetic field.

The corrosion detector in accordance with the invention depends on the detection of small magnetic field gradients arising from the corrosion currents at or near the specimen surface. In order to "simulate" a corrosion field with a known magnitude, consider a single thin wire carrying current, i(t) in the Z direction running through the point P with coordinates $(0, 0, Z_p)$ as shown in FIG. 1. The component of the magnetic field in the X direction, $B_x$ is given by, $$B_x = \frac{\mu_o i Y}{2\pi(X^2 + Y^2)}$$

where $\mu_o$ is the permeability in a vacuum

The derivative of $B_x$ in the Y direction is, $$\frac{\partial B_x}{\partial Y} = \frac{\mu_o i}{2\pi}\left[\frac{1}{(X^2 + Y^2)} - \frac{2Y^2}{(X^2 + Y^2)^2}\right]$$

If the median plane is a distance Y=d above the surface 1, then $$\frac{\partial B_x}{\partial Y} Y = d = \frac{\mu_o i}{2\pi d^2} \cdot \frac{X^2/d^2 - 1}{(1 + X^2/d^2)^2}$$

At $X=0$, $\delta B_x/\delta Y$ has its maximum value of $-\mu_o i/2\pi d^2$. Thus, obtaining the first derivative of the magnetic field provides the ability to locate corrosion activity on the surface of a metal.

Figure 2:
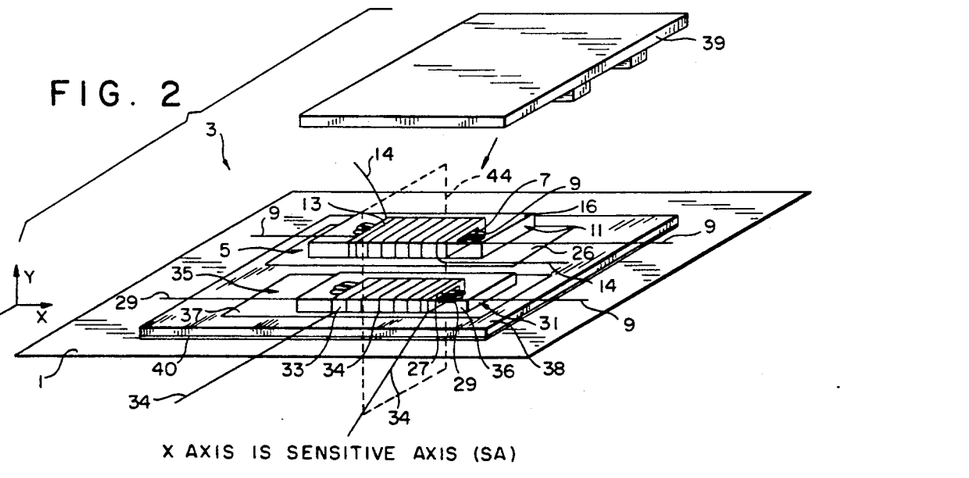
FIG. 2 is a perspective view of a first embodiment of the invention.
Figure 3:
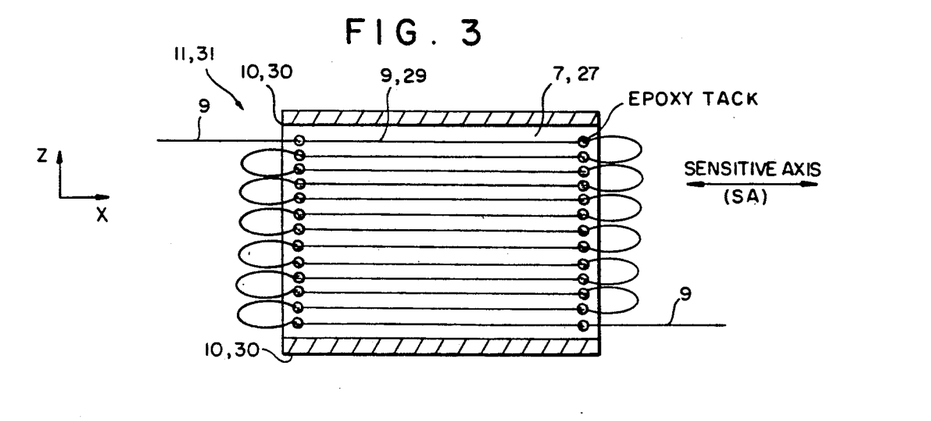
FIG. 3 is a top view of a transducer made in accordance with the invention and showing an optical fiber tacked onto the surface of a magnetostrictive foil.

A corrosion detector head, generally designated by reference numeral 3 is shown in FIG. 2. The corrosion detector head 3 is constructed using two vertically offset magnetic transducers each of which has a magnetically sensitive axis oriented along the field direction whose first derivative is to be measured. In the example of FIG. 2, transducers 5 and 35 are offset in the y direction relative to one another, and each transducer is oriented with its magnetically sensitive axis along the x direction. Transducers 5, 35 are in the form of thin rectangular boxes, each containing a thin layer of magneto-strictive glass 7, 27. FIG. 3 shows a top view of a transducer core 11, 31 which is located inside each of the transducers 5, 35 respectively. Optical fiber 9, 29 is secured to the surface of the magneto-strictive glass 7, 27 using an epoxy tack. The magnetostrictive glass is typically on the order of 0.001" thick. Spacer strips 10, 30 are placed on either side of the magneto-strictive glass 7, 27 alongside the optical fiber 9, 29, respectively. As seen in FIG. 2, the transducer core 11, 31 is placed inside a mandrel 13, 33 around which a wire 14, 34 is wrapped, respectively.

Figure 4:
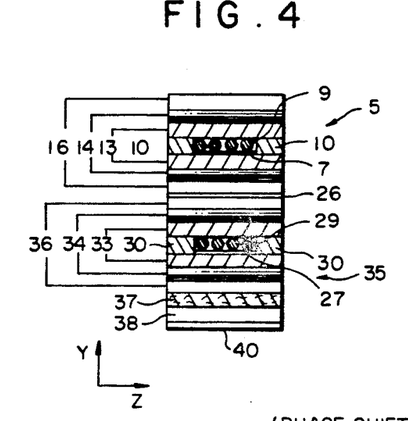
FIG. 4 is cross-sectional view of the corrosion detector head taken along plane 44 of FIG. 2.
Figure 5:
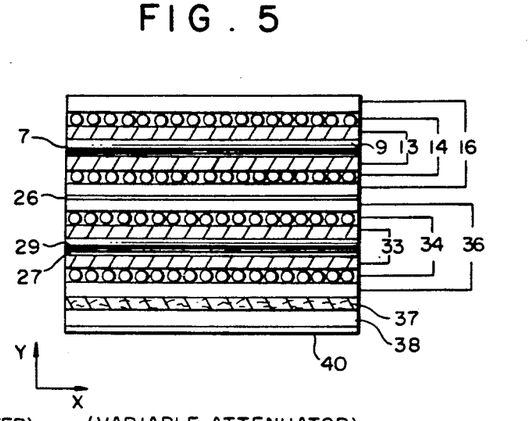
FIG. 5 is a cross-sectional view of the corrosion detector head as taken along a plane perpendicular to plane 44 of FIG. 2.

Each transducer is then wrapped in a metal foil 16, 36. The transducers 5, 35 are then sandwiched on top of each other with a piece of tissue paper 26 between them as shown in FIGS. 2, 4 and 5. It is noted that FIG. 4 is not to scale in relation to FIG. 3, and only a few of the many passages of optical fiber 9 are shown in FIG. 4.

In operation, the sandwiched transducers are placed on another piece of tissue paper 37 and placed on top of a base plate 38 and clamped down with a hold down piece 39, which is secured to the base plate 38 as seen in FIG. 2. The base plate 38 has a coating 40 on the side opposite the transducers in order to prevent the base plate 38 from scratching the surface 1 to be measured. Rollers or wheels can be placed at the base plate 38 to facilitate scanning over the surface 1.

The corrosion detector head 3 must remain as thin as possible in order to detect weak magnetic fields near the surface 1. Thus, the corrosion detector detects magnetic fields and their gradients arising from currents at the corrosion sites in the near field. FIG. 4 shows a cross-sectional view of the sandwiched transducers as taken along the plane 44 of FIG. 2. FIG. 5 shows the cross-sectional view of the sandwiched transducers as taken in a plane perpendicular to plane 44. Typical thicknesses are as follows: the spacer strips 10, 30 are 0.030", the walls of the mandrel 13,33, are 0.030", the wires 14, 34, have a diameter of 0.002", the walls of the aluminum foil 16,36, are 0.003", the tissue paper 26, is 0.001", the base plate 38, is 0.030", and the base plate coating 40, is 0.001". Hence, the corrosion detector has a total stack thickness of about 0.230".

Figure 6:
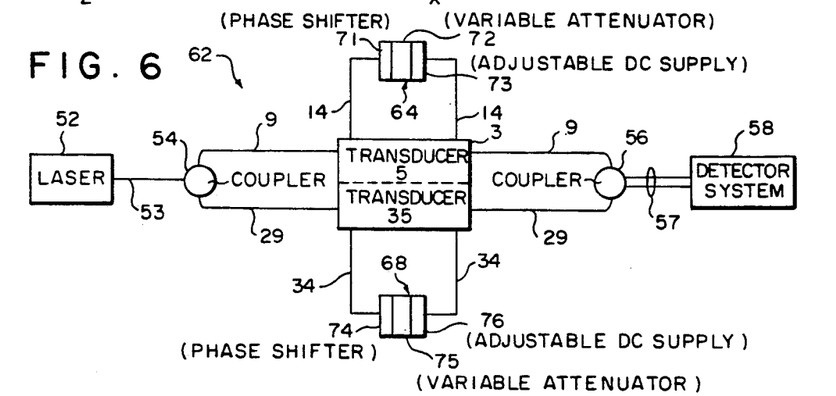
FIG. 6 is a block diagram of the first embodiment of the invention.

Operation of the corrosion detector is similar to the operation of the fiber optic field gradiometer described in U.S. Pat. No. 4,814,706 and incorporated herein by reference. Balance is continuously nullable as described in U.S. Pat. No. 4,904,940 and incorporated herein by reference. In this case, however, only two magnetic transducers 5, 35 are used. Referring to FIG. 6, corrosion detector 62 is illustrated as comprising magnetic transducers 5,35 and associated optics. Light from a laser 52 is launched through a coupler 54 into the single mode fibers 9, 29 and recoupled after passing through the transducers 5, 35 at a coupler 56. The output of the coupler 56 is fed through two optical fibers 57 into detector system 58, wherein the detector system 58 contains for instance two PIN diode detectors to detect the output of each of the fibers 57.

In a manner similar to that described in U.S. Pat. No. 4,814,706, the two transducers 5, 35 having fibers 9, 29 recoupled at coupler 56 comprise a Mach-Zender interferometer with both fibers 9, 29 operating as measurement arms. Detector system 58 provides active stabilization in order to maintain the corrosion detector in quadrature. Hence, the corrosion detector 62 is not affected by random phase drift due to small environmental changes and the phase of the interference signal emanating from the coupler 56 is locked. Circuits 64 and 68, connected to the magnetic wires 14 and 34 respectively, serve the same roles as the applied magnetic field circuit 30 in U.S. Pat. No. 4,814,706. The wires 14 and 34 are wrapped around the mandrels 13 and 33 respectively with sufficient turns to provide easy control of the applied magnetic field of appropriate magnitude. Each circuit 64, 68 is equipped with a phase shifter 71,74 and a variable attenuator 72,75 so that AC and DC magnetic fields created in transducers 5 and 35, respectively may be independently adjusted for amplitude and phase. In addition, a static DC magnetic field bias may be applied by adjusting the magnitude of the voltage at a DC supply 73,76 contained in each circuit 64, 68, respectively. The DC magnetic biases are applied in order to compensate for any material response differences, to compensate for earth's magnetic field, and to provide the appropriate bias field to ensure that the magneto-striction is quadratic in field strength. Also, the AC field is used to up convert a DC signal of interest to a convenient frequency f well away from the effects of noise at extremely low frequencies.

Figure 7:
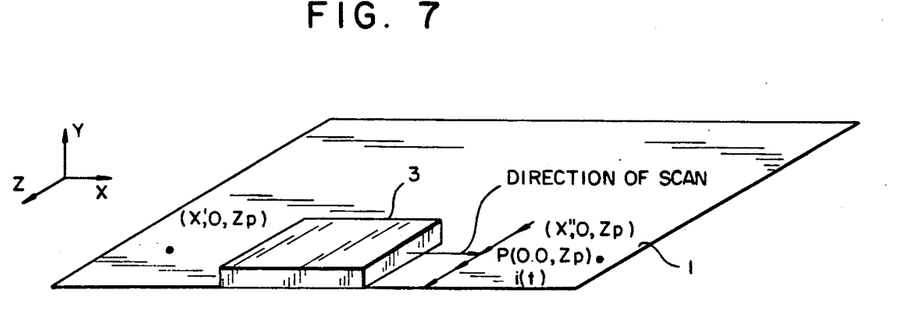
FIG. 7 is a diagrammatic view of the corrosion detector head on a surface 1.
Figure 8:
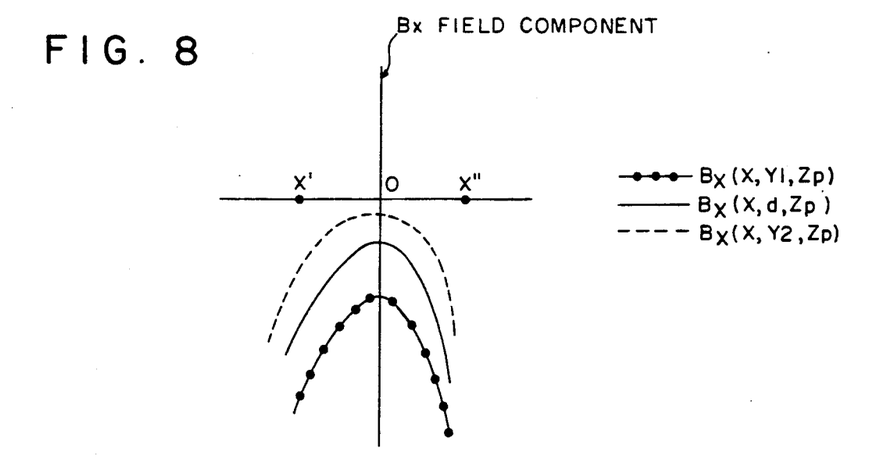
FIG. 8 is a graph of the x component of the magnetic field.

An object of the invention is to provide a compact device which can be scanned across a surface in order to locate corrosion activity. Referring to FIGS. 1 and 7 a corrosion current i(t) can be detected by scanning the corrosion detector head 3 back and forth in the X direction over the corrosion current i(t), where plane Y2 corresponds to the magneto-strictive glass 7 in transducer 5 and plane Y1 corresponds to the magneto-strictive glass 27 in transducer 35. As the corrosion detector head 3 passes over the point P (see FIGS. 1 and 8) the value of the magnetic field component $B_x$ varies at $Y=Y1$, $Y=d$, and $Y=Y2$ as shown in FIG. 8. Typically, a null condition is initially achieved during set up or calibration so as to compensate for small differences in any defective coupling of the fibers to the magneto-strictive glass at each transducer. After nulling, the corrosion detector head is passed over the corrosion current i(t), and the magnetostrictive glass 7 and 27 expands or contracts. However, the X component $B_x$ of the magnetic field will not change at the same rate in the planes Y1 and Y2. Since the magnitude of $B_x$ is larger at plane Y1 than at plane Y2, the magneto-strictive glass 27 will expand or contract more than the magneto-strictive glass 7. Hence, the effective optical path length difference between the two fibers 9 and 29 is changed. Also, as mentioned above, with the appropriate field biasing, this path length change is quadratic in the magnetic field. Hence, at balance, the phase of the remaining signal at frequency, f is proportional to the difference between the DC external field at planes Y2 and Y1.

At balance, the difference in the value of the X component of the magnetic fields, $B_x$ between the plane Y1 and Y2 is proportional the intensity at the output of coupler 56. Provided that the value of $B_x$ varies monotonically over the distance s between the planes Y1 and Y2, the corrosion detector provides an output proportional to the gradient of $B_x$, $\delta B_x/\delta y|_{y0}$ evaluated at some point Y0, where Y1<Y0<Y2. Y does not necessarily equal the midpoint d. However, this discrepancy remains fixed as long as the distance d corresponding to the median plane and the distance s (see FIG. 1) remains fixed. Therefore, the discrepancy may be compensated by rescaling, or increasing the number of passes of fiber on the transducer 5.

Another object of the invention is to provide a corrosion detector with high enough sensitivity to detect corrosion currents. The present sensitivity of gradient detection, using magneto-strictive foil that has not been annealed, is $8.3 \times 10^{-9}$ Gauss/ centimeter for approximately 52 meters of fiber on each transducer. Here, in order to detect corrosion currents distributed over small areas, it is desirable to keep the spatial resolution of the detector high, e.g. $\pm \frac{1}{4}$ centimeters on a side. Hence, the magneto-strictive glass should be about 1" by 1", and consequently about 192 one centimeter passes of fiber 9, 29 fit on each magneto-strictive glass 7, 27. This decreases the sensitivity of the corrosion detector to about $3 \times 10^{-7}$ Gauss/ centimeter. If the magneto-strictive glass 7, 27 is annealed, this value will be one order of magnitude more sensitive, or $3 \times 10^{-8}$ Gauss/centimeter. This is sufficient to measure the field magnitudes. By increasing the area of the magneto-strictive glass 7, 27, which in turn allows both an increased number of passes of fiber 9, 29 and each pass of fiber to exceed one centimeter, the sensitivity of the corrosion detector can be increased to as high as $10^{-9}$, $10^{-10}$ or even $10^{-11}$ Gauss/centimeter.

Figure 9:
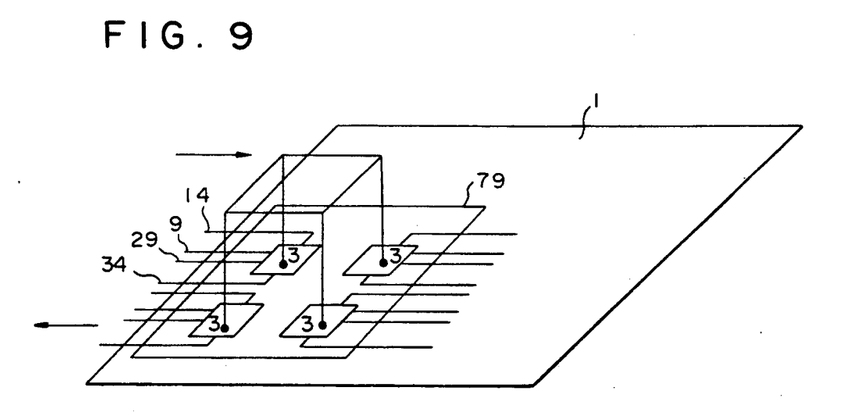
FIG. 9 is a diagrammatic representation of a second embodiment of the invention.
Figure 10:
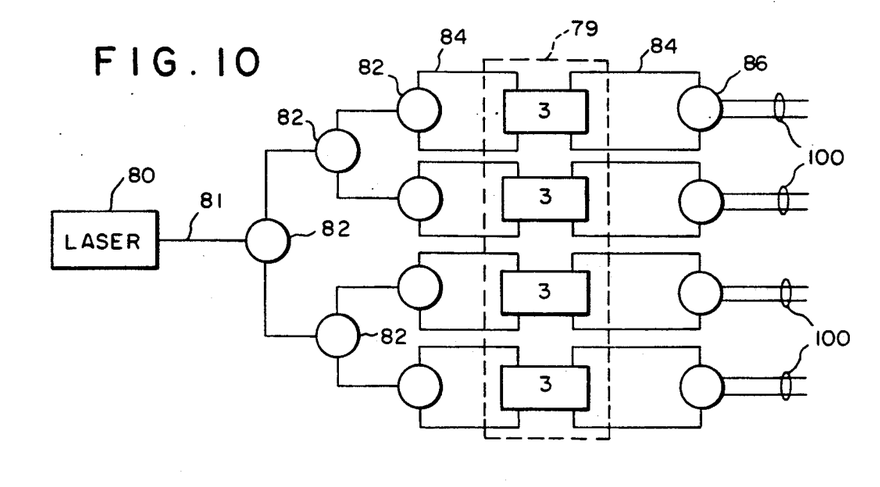
FIG. 10 is a schematic representation illustrating the driving of several corrosion detector heads using one laser.

A second embodiment of the invention is shown in FIG. 9, where multiple corrosion detector heads 79 can be placed in parallel and/or in series. Here, as in the previous cases, each corrosion detector head 3 can be scanned across the surface 1 and/or the surface 1 can be moved across the corrosion detector head. FIG. 9 may be implemented with a plurality of lasers, one laser corresponding to each detector 3 as shown in FIG. 6. Alternatively, a single laser 80 together with 2×2 couplers 82 can supply radiation to multiple corrosion detector heads as shown in FIG. 10. In FIG. 10, the light output from the laser 80 is launched into the fiber 81 and is split into 8 optical fiber outputs 84, which are inputted into the multiple corrosion detector heads 79 and then recombined at the fiber optic couplers 86, whose optical fiber outputs 100 provide the same information as the optical fibers 57 in FIG. 6.

Figure 11:
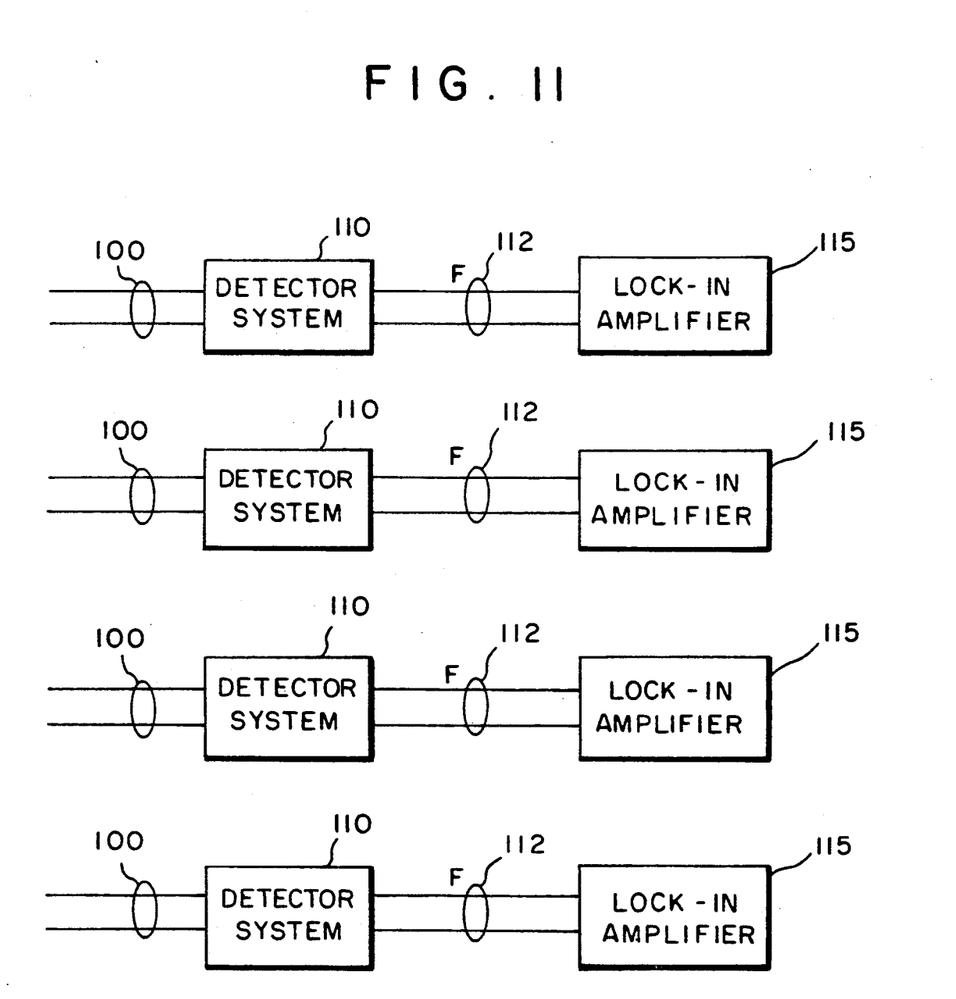
FIG. 11 is a schematic diagram showing multiple corrosion detector outputs with no multiplexing.

The signal at the fiber optic outputs 100 can be detected using detector systems 110 as shown in FIG. 11. In this case, the signals appearing as outputs on lines 112 and fed to lock-in amplifier (LIA) 115 may have the same frequency f or different frequencies. The LIA 115 is used to demodulate the signal. Other phase detection/demodulation devices may be used in place of LIA 115.

Figure 12A:
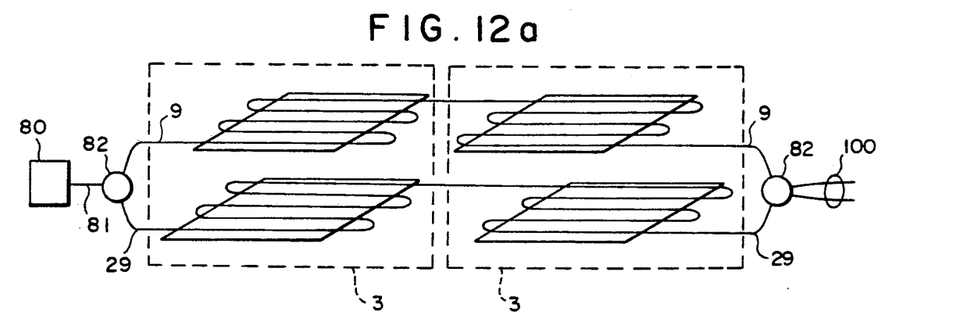
FIG. 12a is a diagrammatic representation of a multiple corrosion detector head system with two corrosion detector heads on one optical interferometer.
Figure 12B:
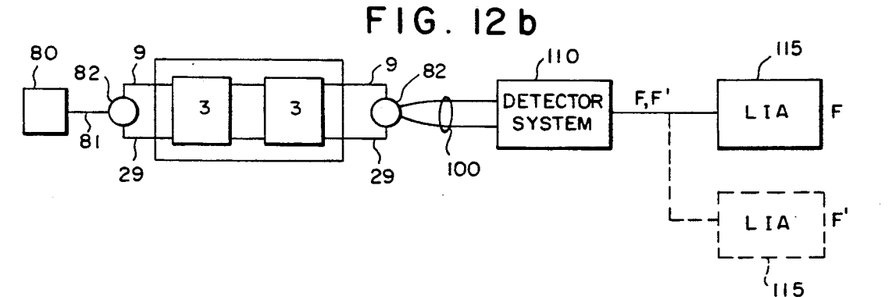
FIG. 12b is a corresponding schematic diagram of the multiple corrosion detector head system including a detector system and lock-in amplifier(s).

FIG. 12a shows a multiple corrosion detector head system using a single optical interferometer with two corrosion detector heads 3 placed in series. Each detector head can be driven at different frequencies, e.g. F and F'. The fiber optic output is then detected by the detector system 110 shown in FIG. 12b using the two signals, one at each frequency F and F'. The LIA 115 can then lock in on either the signal at frequency F or the signal at frequency F'. A second LIA 115 could be used to simultaneously detect signals at frequencies F and F'. Using multiple lock-in amplifiers 115 as many as 10 such signals could fit into a 30 Hz bandwidth. When the multiple corrosion detector head system is at balance the particular detector head 3 which is proximate corrosion activity causes a change in phase of the signal with a frequency corresponding to that particular detector head 3 and hence a change in output voltage of the lock-in amplifier 115 locked in to that particular frequency, thereby permitting location of the corrosive area.

Figure 13A:
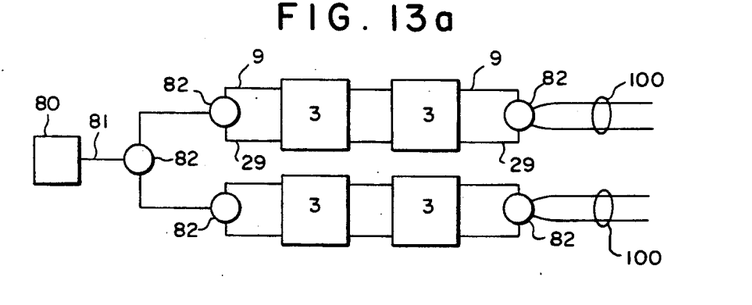
FIG. 13a is a schematic diagrams showing a multiple corrosion detector head system using two optical interferometers each with two corrosion detector heads.
Figure 13B:
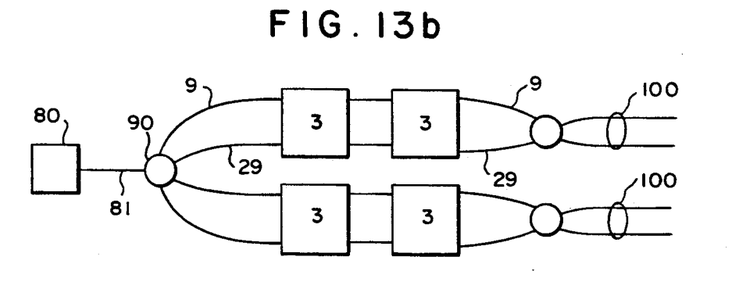
FIG. 13b shows a corresponding system using a star coupler in place of the 2×2 couplers.

FIGS. 13a and 13b show a schematic diagram of a multiple corrosion detector head system with multiple optical interferometers each having multiple detector heads. FIG. 13a shows how five 2×2 couplers 82 are used to create two optical interferometers. FIG. 13b shows that a single star coupler 90 can replace three 2×2 couplers 82. As was discussed with reference to FIG. 12b, each corrosion detector head 3 is at a different frequency. Again, when the system is at balance, the particular detector head 3 which is proximate corrosion activity causes a change in phase of the signal with a frequency corresponding to that particular detector head 3, and hence a change in output voltage of the lock-in amplifier 115 locked in to that particular frequency.

The advantages of the present invention are numerous. It will find great utility as a small, light-weight corrosion detector capable of scanning the surface of a specimen such as an aircraft wing. The corrosion detector head itself is significantly less expensive to manufacture than SQUID devices. It is also rugged, and easy to use in the field, since it does not suffer from drastic directional sensitivity as does a vector magnetometer. It requires no shielded environment, and is immune from environmental field gradients unless they vary drastically over a 1 centimeter distance at the location of the sensor.

Although the invention has been described relative to specific embodiments, thereof, it is not so limited, and numerous variations and modifications thereof will be readily apparent to those skilled in the art in light of the above teaching. It is therefore to be understood that within the scope of the appended claims, the invention may be practiced otherwise then as specifically described.

What is claimed is:

1. A corrosion detector for use in detecting an external near magnetic field resulting from corrosion currents in an object comprising:
   (a) a detector head comprising:
      (1) at least a first and second magnetic transducer said transducers being sensitive to magnetic fields;
      (2) at least a first and second optical fiber, said first optical fiber secured to said first magnetic transducer on a surface thereof and said second optical fiber secured to said second magnetic transducer on a surface thereof, wherein said first and second optical fibers define a first and second optical path, respectively said optical paths being alterable by said transducers;

(b) laser means coupled to said first and second optical fibers for providing laser light to said first and second optical fibers, wherein said laser light travels along said first and second optical paths;

(c) applied magnetic field generating means for immersing each of said first and second magnetic transducers in an applied magnetic field having an AC and a DC component; and (d) means operative when said first and second optical fibers are subjected to said external near magnetic field for detecting an optical path length change between said first optical path and said second optical path, said means for detecting said optical path length change comprising a first optical coupler for coupling said first and second optical fiber to first output optical fibers and detector means for converting laser light output from said first output optical fibers into a signal voltage proportional to a first derivative of said external near magnetic field when said detector head is positioned in said near field closely proximate to a surface of said object so as to detect said external near magnetic field resulting from said corrosion currents caused by metal ions flowing between at least two metal surfaces.

2. A corrosion detector as claimed in claim 1, wherein said first and second magnetic transducers are generally planar.

3. A corrosion detector as claimed in claim 1, wherein said first and second optical fibers comprise single mode fibers.

4. A corrosion detector as claimed in claim 2, wherein said first and second optical fibers comprise single mode fibers.

5. A corrosion detector as claimed in claim 1, wherein said first output optical fibers are a single mode fiber.

6. A corrosion detector as claimed in claim 1, wherein said applied magnetic field generating means comprises a means for independently adjusting said AC and DC components of said applied magnetic field.

7. A corrosion detector as claimed in claim 1, wherein said applied magnetic field generating means comprises a means for independently adjusting amplitude and phase characteristic of said AC component and the magnitude and polarity characteristics of said DC component of said applied magnetic field.

8. A corrosion detector as claimed in claim 1, wherein said detector means comprises a detector coupled to signal processing electronics.

9. A corrosion detector as claimed in claim 7, wherein said means for independently adjusting said AC and DC components of said applied magnetic field are operable for nulling effects due to differences in materials, nulling the earth's magnetic field, and for establishing an appropriate bias field when said detector is not subjected to said external near magnetic field.

10. A corrosion detector as claimed in claim 1 further including:

(e) a third and fourth magnetic transducer;

(f) a third and fourth optical fiber, wherein said third and fourth optical fiber is secured to said third and fourth magnetic transducers, respectively, and said third and fourth optical fibers define a third and fourth optical path, and said laser means is coupled to said third and fourth optical fiber to provide laser light within said third and fourth optical fiber, and said laser light travels along said third and fourth optical paths; and (g) second means operative when said third and fourth optical fibers are subjected to said external near magnetic field resulting from corrosion currents for detecting a second optical path length change between said third optical path and said fourth optical path, wherein said second optical path length change provides an indication of the first derivative of said external near magnetic field.

11. A corrosion detector as claimed in claim 10 wherein said second means for detecting an optical path length change comprises;

a second optical coupler for coupling said third and fourth optical fibers to second output optical fibers;

second detector means for converting laser light output from said second output optical fibers into a second electric signal proportional to the derivative of a second external near magnetic field.

12. A corrosion detector as claimed in claim 1 further including:

(e) a third and fourth magnetic transducer; wherein said first and second optical fibers are secured to said third and fourth magnetic transducers, respectively; and (f) said detecting means operative when said first and second optical fibers are subjected to said external magnetic field resulting from corrosion currents for detecting said optical path length change between said first optical path and said second optical path, wherein said optical path length change provides an indication of the first derivative of said external near magnetic field.

13. A corrosion detector as claimed in claim 10, wherein each of said optical fibers is a single mode fiber.

14. A corrosion detector as claimed in claim 11, wherein each of said optical fibers is a single mode fiber.

15. A corrosion detector as claimed in claim 12, wherein each of said optical fibers is a single mode fiber.

16. A corrosion detector as claimed in claim 1 wherein, in operation, said first and second transducers are sandwiched together.

17. A corrosion detector as claimed in claim wherein said first and second transducers are spaced apart from one another by a distance of about 1 cm or less.

18. A corrosion detector as claimed in claim 1 wherein said first and second transducers have a sensitivity on the order of $10^{-6}$ Gauss/cm.

19. A corrosion detector as claimed in claim 1 wherein said first and second transducers have a sensitivity on the order of $10^{-7}$ Gauss/cm.

20. A corrosion detector as claimed in claim 1 wherein each transducer comprises:

(i) a thin sheet of magneto-strictive material;

(ii) an optical fiber secured to a surface of said sheet of magneto-strictive material;

(iii) a mandrel for surrounding said magneto-strictive material and said secured optical fiber;

(iv) a wire surrounding said mandrel, said wire forming part of said applied magnetic field generating means.

21. A corrosion detector as claimed in claim 20 wherein said first and second transducers are sandwiched together and wherein said total stack thickness of said transducers is on the order of 0.2 inches.

22. A corrosion detector as claimed in claim 20 wherein for each of said first and second transducers, the thickness of said magneto-strictive material is on the order of 0.001 inches and said optical fiber is secured to only one surface of said magneto-strictive material.

23. A method of detecting corrosion the method comprising the steps of:
   a) orienting a magnetically sensitive axis of a first and second magnetic transducer along a given field direction, where a first and second fiber is secured to said first and second magnetic transducers respectively;
   transmitting a coherent radiation beam through each of said first and second optical fibers, said first and second optical fibers defining respectively, first and second optical paths;
   c) applying a bias magnetic field having AC and DC components to immerse each of said first and second magnetic transducers in said bias magnetic field;
   d) in the absence of an external magnetic field resulting from said corrosion, detecting an optical path length change between said first and said second optical paths and adjusting said AC and DC components of said bias magnetic field to establish a bias field;
   e) passing said first and second transducers over the surface to be measured, in an external near magnetic field closely adjacent thereto;
   f) then, while performing step e), detecting a total optical path length difference between said first and second optical paths by coupling light from said first and second optical fibers to first output optical fibers and converging light output from said first output optical fibers into an electrical signal proportional to a first derivative of said external near magnetic field resulting from corrosion currents generated within or on the surface by metal ions flowing between at least two metal surfaces.

24. A method as claimed in claim 23, wherein said external near magnetic field also results from an object on or in a planet, such as Earth, and wherein said step d) includes adjusting said AC and DC components to nullify effects of differences in materials utilized for said magnetic transducers and optical fibers and for nullifying effects of said planet's magnetic field and other fields whose measurements are not of interest.

25. A method as claimed in claim 24, wherein step f) includes:
   directing radiation from said first output optical fibers onto a detector to produce said electrical signal proportional to the first derivative of said external near magnetic field.

26. A method of detecting corrosion as claimed in claim 23, wherein step b) includes energizing a single mode laser source to generate a single mode coherent radiation beam.

27. A method of detecting corrosion as claimed in claim 25, wherein optical fibers for said first and second optical fibers and first output optical fibers are single mode fibers.

28. An apparatus for detecting corrosion within or on the surface of an object to be tested comprising:
   (a) a detector head comprising:
      (1) at least a first and second magnetic transducer sandwiched together in close proximity to one another and to the surface to be tested the first and second magnetic transducers being sensitive to magnetic fields;
      (2) at least a first and second optical fiber, said first optical fiber secured to said first magnetic transducer and said second optical fiber secured to said second magnetic transducer, wherein said first and second optical fibers define a first and second optical path said optical paths being alterable by said transducers, respectively;
   (b) laser means coupled to said first and second optical fibers for providing laser light to said first and second optical fibers, wherein said laser light travels along said first and second optical paths;
   (c) applied magnetic field generating means for immersing each of said first and second magnetic transducers in an applied magnetic field having an AC and a DC component; and
   (d) means operative when said first and second optical fibers are subjected to an external near magnetic field for detecting an optical path length change between said first optical path and said second optical path, said means for detecting said optical path length change comprising a first optical coupler for coupling said first and second optical fiber to first output optical fibers and detector means for converting laser light output from said first output optical fibers into a signal voltage proportional to a first derivative of said external magnetic field;
   wherein said detector head is sufficiently flat so as to detect said external near magnetic field generated by corrosion currents within or on the surface of the object to be tested.

29. A method of detecting corrosion as claimed in claim 28, wherein said magnetic transducers are separated by an amount on the order of 1 cm or less.

30. A method of detecting corrosion as claimed in claim 28, wherein said transducers have a total stack thickness on the order of 0.2 inches.

31. A method of detecting corrosion as claimed in claim 28, wherein said first and second optical fibers are secured to only a surface of said respective first and second transducers so as to produce a relatively thin stack thickness of said two sandwiched transducers.

32. An apparatus for detecting corrosion within or on the surface of an object comprising:
   (a) a detector head comprising:
      (1) at least a first and second magnetic transducer said transducers being sensitive to magnetic fields;
      (2) at least a first and second optical fiber, said first optical fiber secured to said first magnetic transducer and said second optical fiber secured to said second magnetic transducer, wherein said first and second optical fibers define a first and second optical path, respectively said optical paths being alterable by said transducers;
   (b) laser means coupled to said first and second optical fibers for providing laser light to said first and second optical fibers, wherein said laser light travels along said first and second optical paths;
   (c) applied magnetic field generating means for immersing each of said first and second magnetic transducers in an applied magnetic field having an AC and a DC component; and
   (d) means operative when said first and second optical fibers are subjected to said external near magnetic field resulting from said corrosion for detecting an optical path length change between said first optical path and said second optical path, said means for detecting said optical path length change comprising a first optical coupler for coupling said first and second optical fiber to first output optical fibers and detector means for converting laser light output from said first output optical fibers into a signal voltage proportional to a first derivative of said external near magnetic field;

wherein said detector head has a surface area sufficiently small to locate said corrosion within or on the surface of said object.

33. An apparatus for detecting corrosion as claimed in claim 32 wherein said detector head has a surface area of approximately 1 in.$^2$.

34. A corrosion detector as claimed in claim 1 wherein said first and second transducers have a sensitivity on the order of $10^{-8}$ Gauss/cm.

35. A corrosion detector as claimed in claim 1 wherein said first and second transducers have a sensitivity on the order of $10^{-9}$ Gauss/cm.

36. A corrosion detector as claimed in claim 1 wherein said laser means comprises a laser and, said laser outputs said laser light and said coupler couples said laser to said first and second optical fibers.

37. A corrosion detector as claimed in claim 1 wherein said first and second transducers have a sensitivity on the order of $10^{-10}$ Gauss/cm.

38. A corrosion detector as claimed in claim 1 wherein said first and second transducers have a sensitivity on the order of $10^{-11}$ Gauss/cm.

39. A corrosion detector as claimed in claim 10 wherein said laser means comprises a laser and comprising a star coupler, said laser outputs said laser light and said star coupler wherein couples said laser to said first, second, third and fourth optical fibers.

40. A corrosion detector as claimed in claim 10 wherein said laser means comprises a laser and comprising three 2×2 couplers, wherein said laser outputs said laser light and said three 2×2 couplers couple said laser to said first, second, third and fourth optical fibers.

41. A corrosion detector as claimed in claim 20 wherein for each of said first and second transducers, the thickness of said magneto-strictive material is on the order of 0.001 inches and said optical fiber is secured to both surfaces of said magneto-strictive material.

42. An apparatus for detecting corrosion as claimed in claim 28 wherein said first and second optical fibers are secured to both surfaces of said respective first and second transducers so as to produce a relatively thin stack thickness of said two sandwiched transducers.

* * * * *